United States Patent
Lee et al.

(10) Patent No.: US 6,876,551 B2
(45) Date of Patent: Apr. 5, 2005

(54) HEAT SINK ASSEMBLY INCLUDING CLIP WITH PRESSING AND OPERATING MEMBERS

(75) Inventors: Hsieh Kun Lee, Tu-Chen (TW); Wellint Xia, Shenzhen (CN); Gen-Cai Wang, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/665,994

(22) Filed: Sep. 17, 2003

(65) Prior Publication Data

US 2004/0120119 A1 Jun. 24, 2004

(30) Foreign Application Priority Data

Dec. 20, 2002 (TW) ...................................... 91220811 U

(51) Int. Cl.[7] ................................................. H05K 7/20
(52) U.S. Cl. ....................... 361/702; 361/696; 361/697; 361/710; 257/706; 24/458
(58) Field of Search ................................. 361/695–697, 361/701–704, 709, 710; 257/705, 706, 707, 713, 717–719; 165/80.3, 185; 174/16.3; 248/510; 24/458, 297, 453, 457, 625; 438/122

(56) References Cited

U.S. PATENT DOCUMENTS

| | | | |
|---|---|---|---|
| 5,381,305 A | | 1/1995 | Harmon et al. |
| 5,436,798 A | | 7/1995 | Wieland, Jr. |
| 5,448,449 A | * | 9/1995 | Bright et al. ............... 361/704 |
| 5,621,244 A | | 4/1997 | Lin |
| 5,671,118 A | * | 9/1997 | Blomquist ................... 361/704 |
| 5,761,036 A | * | 6/1998 | Hopfer et al. ............... 361/704 |
| 5,771,960 A | * | 6/1998 | Lin ............................. 165/80.3 |
| 5,870,288 A | * | 2/1999 | Chen ........................... 361/704 |
| 5,933,326 A | * | 8/1999 | Lee et al. .................... 361/704 |
| 5,979,025 A | * | 11/1999 | Horng .......................... 24/459 |
| 6,101,096 A | | 8/2000 | MacGregor et al. |
| 6,250,375 B1 | * | 6/2001 | Lee et al. ................... 165/80.3 |
| 6,449,817 B1 | * | 9/2002 | Hsu ............................. 24/459 |
| 6,452,801 B1 | * | 9/2002 | Chen ........................... 361/704 |
| 6,483,703 B2 | * | 11/2002 | Hsu ............................. 361/704 |
| 6,570,763 B1 | * | 5/2003 | McHugh et al. ............ 361/704 |
| 6,731,506 B1 | * | 5/2004 | Dong et al. ................. 361/719 |
| D492,655 S | * | 7/2004 | Yu ............................. D13/179 |
| 6,778,395 B1 | * | 8/2004 | Dong et al. ................. 361/704 |
| 2004/0032720 A1 | * | 2/2004 | McHugh et al. ............ 361/719 |
| 2004/0125567 A1 | * | 7/2004 | Lee et al. .................... 361/707 |

FOREIGN PATENT DOCUMENTS

| | | |
|---|---|---|
| TW | 246982 | 5/1995 |
| WO | WO 3081641 A2 * | 10/2003 |

* cited by examiner

Primary Examiner—Anatoly Vortman
(74) Attorney, Agent, or Firm—Wei Te Chung

(57) ABSTRACT

A heat sink assembly includes a heat sink (30), a processing unit (70), a socket (40) and a clip (1). The processing unit is mounted on the socket. Two catches (42) are provided at opposite sides of the socket. The clip includes a operating member (10) and a pressing member (20). The operating member includes a main body (14) and a handle (12). Two resilient portions (142) are formed from opposite sides of the main body. A first latching leg (146) with a fixing hole (144) extends downwardly from the main body. The pressing member includes two opposite pressing portions (24), and opposite first and second beams (22,26). A second latching leg (224) with a fixing hole (222) extends downwardly from the first beam. Two cutouts (262) are defined at a side of the pressing member, the resilient portions snappingly engaging with the pressing member in the cutouts.

18 Claims, 5 Drawing Sheets

HEAT SINK ASSEMBLY INCLUDING CLIP WITH PRESSING AND OPERATING MEMBERS

BACKGROUND OF THE INVENTION

1. Field of the Invention

The present invention relates generally to heat sink assemblies, and in particular to a heat sink assembly removing heat from an electronic package.

2. Related Art

Central processing units (CPUs) of computers can operate at high speeds and thus generate large amounts of heat. As a result, a computer commonly employs a heat sink assembly in order to remove heat from the CPU and ensure that the CPU operates stably.

A conventional heat sink assembly as described in Taiwan Patent No. 246,982 comprises a heat sink, a clip, and a socket supporting an electronic package thereon. A groove is defined in a middle of the heat sink. Two locking protrusions are formed at two opposite sides of the socket. The clip is substantially a metallic strip, and is received in the groove of the heat sink. The clip comprises a pressing portion at a middle portion thereof. Two locking portions extend from two opposite ends of the pressing portion. A locking hole is defined in each locking portion. In assembly, the locking holes engagingly receive the locking protrusions of the socket. The heat sink is thus resiliently pressed onto the electronic package by the pressing portion.

With the continuing boom in electronics technology, numerous modem CPUs are able to process data at unprecedented high speeds. As a result, CPUs can generate huge amounts of heat. To maintain an acceptably low operating temperature of a high-speed CPU, a heat sink must have great heat dissipation capability. A popular way to achieve this aim is to simply provide heat sinks that are larger and heavier than previously. However, many conventional clips such as the above-mentioned clip are not strong enough to securely retain a large, heavy heat sink on the CPU. The heat sink is liable to shift relative to the CPU when the assembly is subjected to vibration or shock during use. This can adversely affect the efficiency of heat removal. The heat sink may even disengage from the CPU altogether.

SUMMARY OF THE INVENTION

Accordingly, an object of the present invention is to provide a heat sink assembly which is easily assembled and which can efficiently remove heat from an electronic package.

To achieve the above-mentioned object, a heat sink assembly in accordance with a preferred embodiment of the present invention comprises a heat sink, a processing unit, a socket and a clip. The processing unit is mounted on the socket. Two catches are provided at opposite sides of the socket. The clip comprises a operating member and a pressing member. The operating member comprises a main body and a handle. Two resilient portions are formed from opposite sides of the main body. A first latching leg with a fixing hole extends downwardly from the main body. The pressing member comprises two opposite pressing portions, and opposite first and second beams. A second latching leg with a fixing hole extends downwardly from the first beam. Two cutouts are defined at a side of the pressing member, and the resilient portions are snappingly engaged with the pressing member in the cutouts.

In an alternative embodiment, two resilient fingers of the operating member define a pair of notches. The resilient fingers engage with the pressing member, whereby the notches intersect with cutouts of the pressing member.

Other objects, advantages and novel features of the present invention will be drawn from the following detailed description of preferred embodiments of the present invention with attached drawings, in which:

DESCRIPTION OF THE PREFERRED EMBODIMENTS

Figure 1:
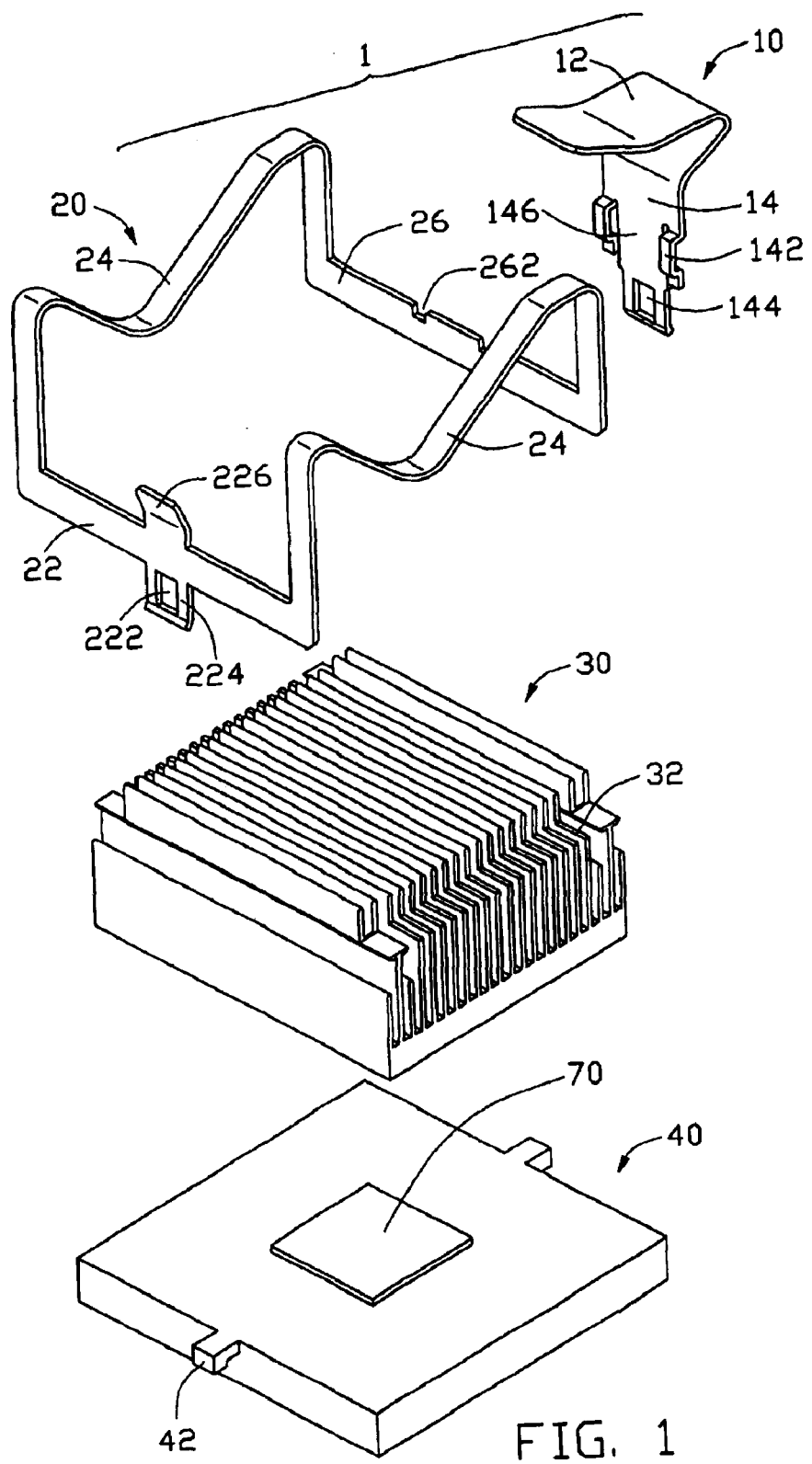
FIG. 1 is an exploded, isometric view of a heat sink assembly in accordance with the preferred embodiment of the present invention.
Figure 2:
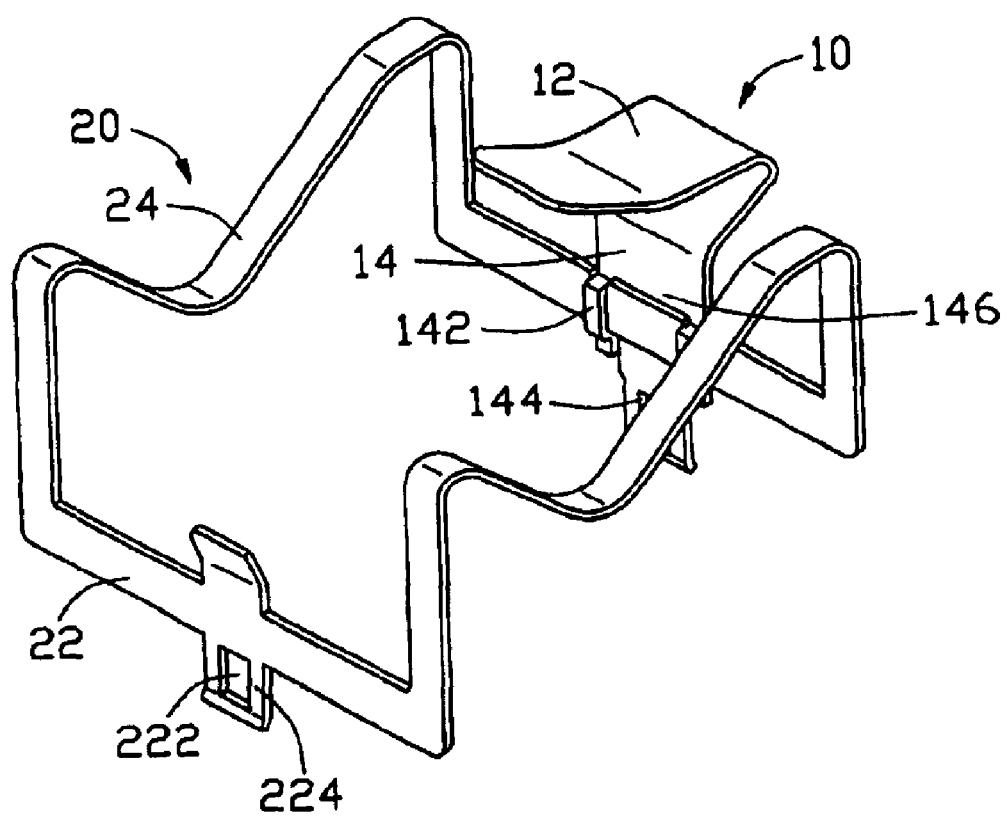
FIG. 2 is an assembled view of a clip of the heat sink assembly of FIG. 1.
Figure 3:
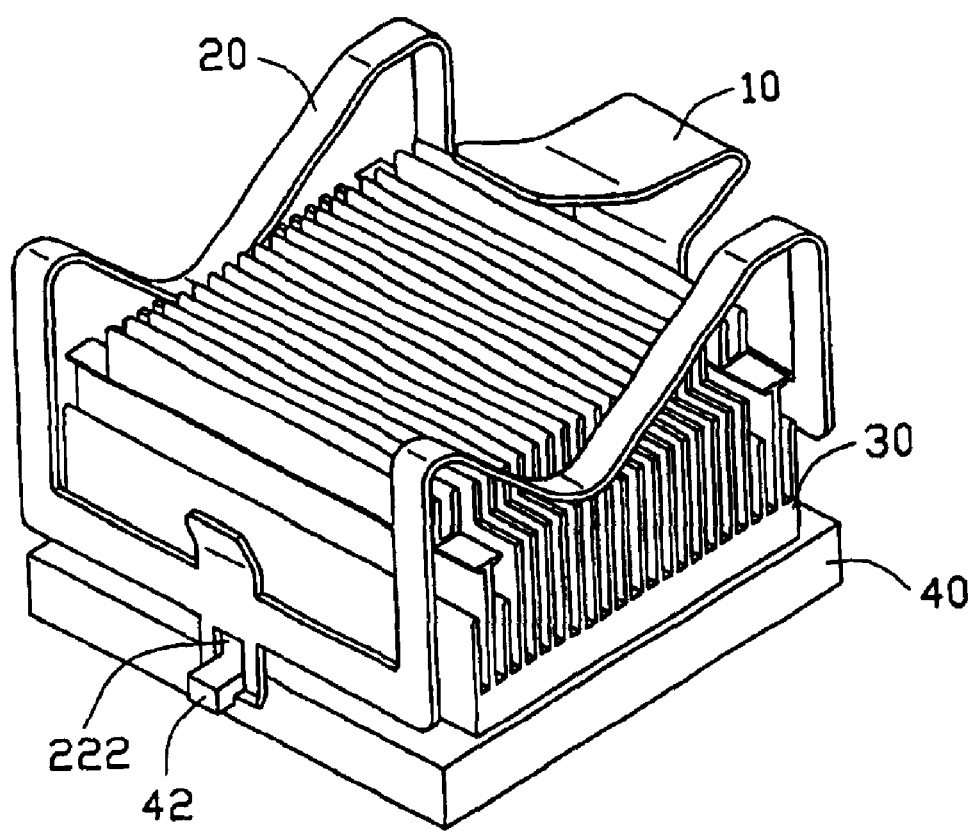
FIG. 3 is an assembled view of FIG. 1.

Referring to FIGS. 1–3, a heat sink assembly in accordance with the preferred embodiment of the present invention comprises a clip 1, a heat sink 30, a socket 40, and an electronic package such as a central processing unit (CPU) 70. The clip 1 cooperates with the socket 40 to secure the heat sink 30 to the CPU 70.

Two catches 42 are provided at opposite sides of the socket 40 respectively. The CPU 70 is mounted on the socket 40. The heat sink 30 is engaged on a top of the CPU 70, for removing heat therefrom. Two shoulders 32 are provided on opposite sides of a top portion of the heat sink 30 respectively. The clip 1 is engaged with the catches 42 of the socket 40, for tightly pressing the heat sink 30 against the CPU 70.

The clip 1 comprises an operating member 10 and a pressing member 20. The operating member 10 comprises a main body 14, and a handle 12 is bent from a top of the main body 14. Two resilient claws 142 are formed inwardly from opposite sides of the main body 14 respectively. A first latching leg 146 with a fixing hole 144 defined therein extends downwardly from a bottom of the main body 14, and is substantially coplanar with the main body 14.

The pressing member 20 comprises two opposite pressing portions 24, and opposite first and second beams 22, 26. The pressing portions 24 are parallel to each other, and are each substantially M-shaped. The first and second beams 22, 26 interconnect corresponding opposite ends of the pressing portions 24, respectively. A second latching leg 224 with a fixing hole 222 defined therein extends downwardly from a middle portion of the first beam 22. A tab 226 extends upwardly from the middle portion of the first beam 22, for facilitating operation of the clip 1. Two cutouts 262 are defined in a top of a middle portion of the second beam 26.

In assembly, the resilient claws 142 and the main body 14 of the operating member 10 cooperate to sandwich the second beam 26 therebetween at the cutouts 262, with upper portions of the resilient claws 142 being received in the cutouts 262. The operating member 10 is thus attached to the pressing member 20, and is prevented from sliding along the second beam 26. The heat sink 30 is placed on a top of the CPU 70, with the pressing portions 24 of the clip 1 resting on the shoulders 32 of the heat sink 30. The fixing hole 222 of the pressing member 20 engagingly receives one of the catches 42 of the socket 40 therein. The handle 12 is depressed until the fixing hole 144 engagingly receives the other catch 42 of the socket 40 therein. The pressing portions 24 thereby resiliently press the shoulders 32, and accordingly tightly press the heat sink 30 onto the CPU 70. Thus, the heat sink 30 is in intimate thermal contact with the top of the CPU 70, for efficient removal of heat from the CPU 70.

In disassembly, the handle 12 is depressed, so that the catch 42 of the socket 40 is released from the fixing hole 144. The clip 1 is then easily removed from the socket 40.

According to the above description, the heat sink assembly of the present invention has the following advantages:
1. The heat sink assembly is easily assembled and disassembled.
2. The pressing portions 24 of the pressing member 20 press on opposite sides of the heat sink 30. The pressing forces provided by the pressing member 20 are evenly distributed on the heat sink 30. The clip 1 thus firmly presses the heat sink 30 against the CPU 70 uniformly.

Figure 4:
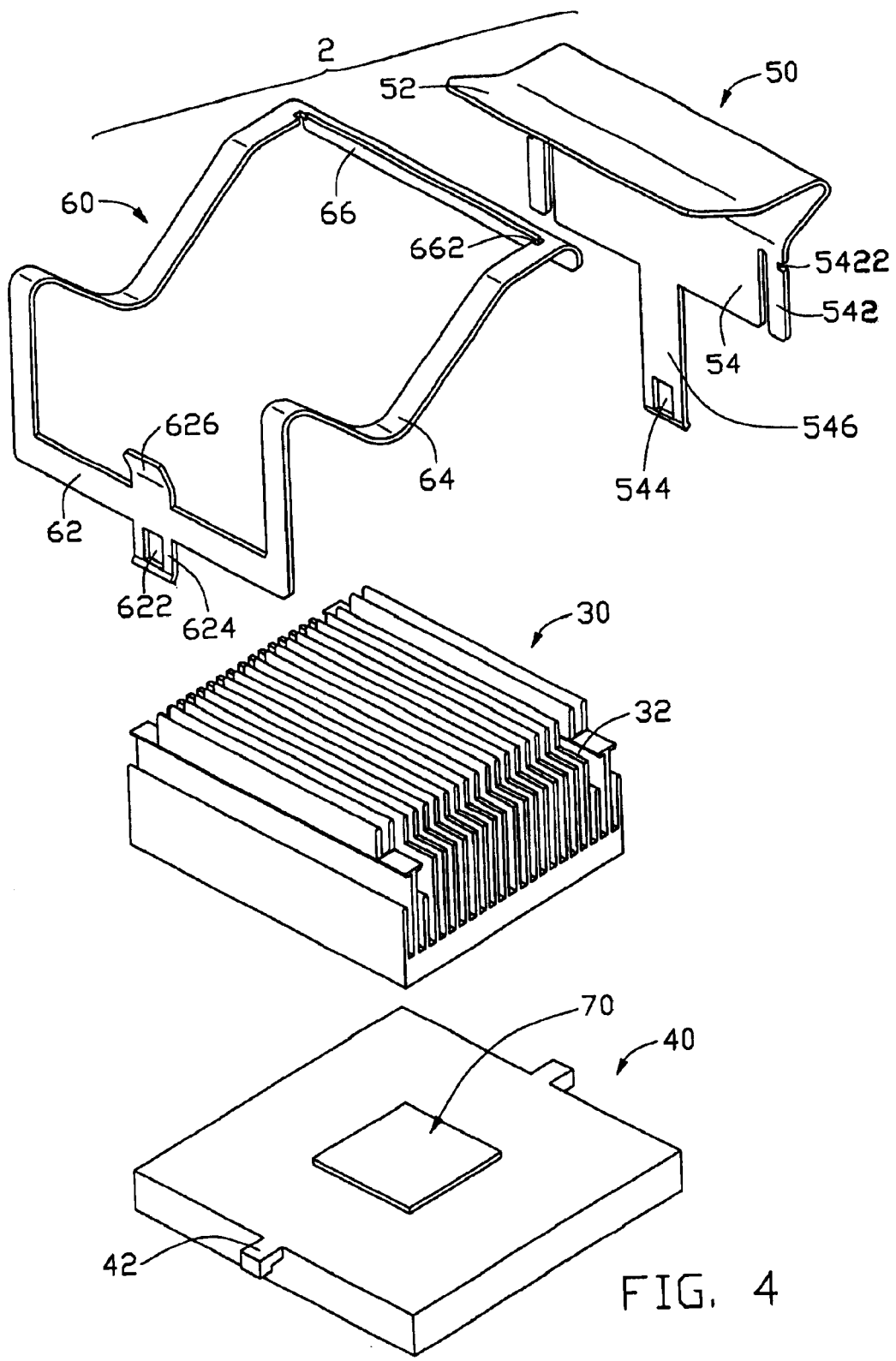
FIG. 4 is an exploded, isometric view of a heat sink assembly in accordance with the alternative embodiment of the present invention.
Figure 5:
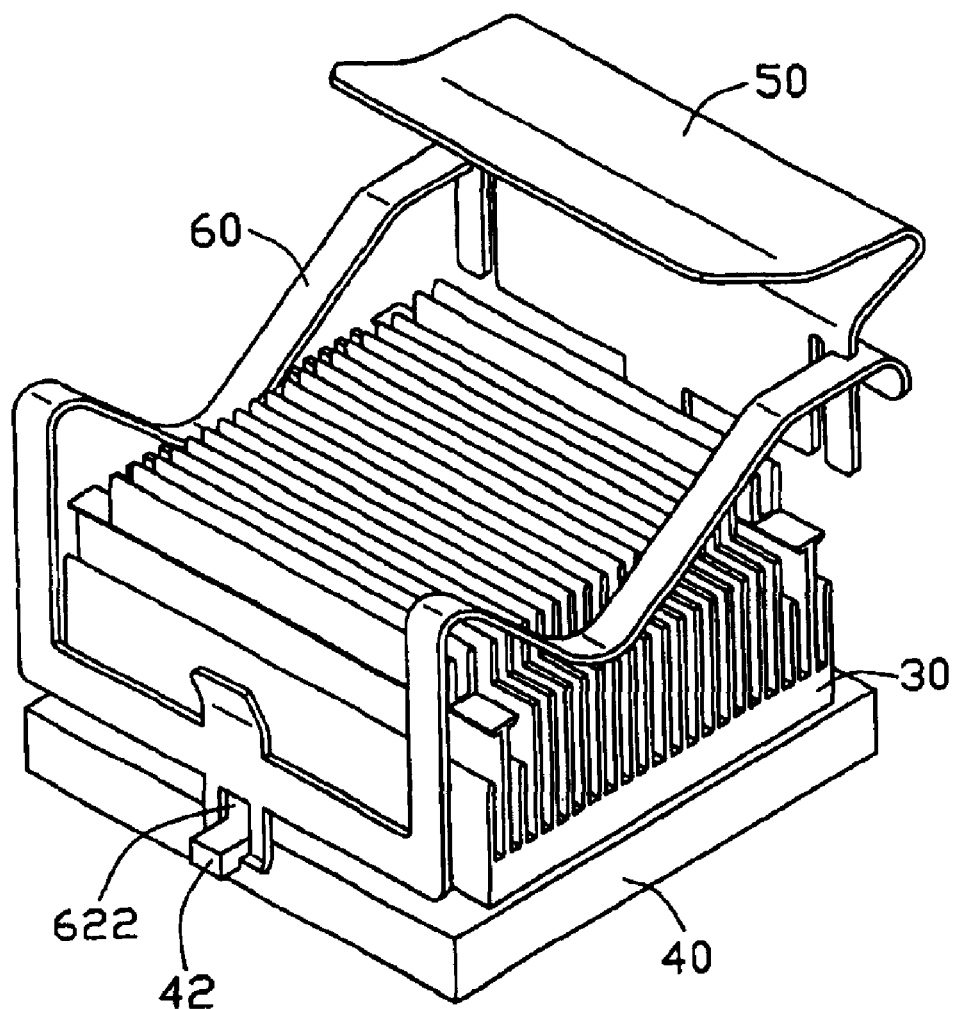
FIG. 5 is an assembled view of FIG. 4.

Referring to FIGS. 4–5, a heat sink assembly in accordance with the alternative embodiment of the present invention comprises a clip 2, a heat sink 30, a socket 40 and a CPU 70. The heat sink 30 has a pair of shoulders 32, and the socket 40 has a pair of catches 42. The heat sink assembly of the alternative embodiment is similar to the heat sink assembly of the preferred embodiment. However, the clip 2 is different from the clip 1 of the preferred embodiment. The clip 2 comprises an operating member 50 and a pressing member 60.

The operating member 50 comprising a main body 54, and a handle 52 is bent from a top of the main body 54. Two resilient fingers 542 are formed at opposite sides of the main body 54 respectively. Two notches 5422 are defined in outer edges of the resilient fingers 542 respectively. A first latching leg 546 with a fixing hole 544 defined therein extends downwardly from a bottom of the main body 54.

The pressing member 60 comprises two opposite pressing portions 64, and opposite first and second beams 62, 66. The pressing portions 64 are parallel to each other, and are each a bent spring strip. The first and second beams 62, 66 interconnect corresponding opposite ends of the pressing portions 64, respectively. A second latching leg 624 with a fixing hole 622 defined therein extends downwardly from a middle portion of the first beam 62. A tab 626 extends upwardly from the middle portion of the first beam 62, for facilitating operation of the clip 2. Two cutouts 662 are defined in inner edges of the pressing portions 64 respectively, adjacent the second beam 66.

In assembly of the clip 2, the main body 54 of the operating portion 50 is placed between the pressing portions 64 of the pressing member 60. The operating portion 50 is moved downwardly, and the resilient fingers 542 are deflected inwardly by the pressing portions 64. When the notches 5422 reach the cutouts 662, the resilient fingers 542 deflect back to their original orientations. The resilient fingers 542 are thereby snappingly engaged with the pressing portions 64. The clip 2 is thus assembled.

Assembly and disassembly of the heat sink assembly of the alternative embodiment are similar to assembly and disassembly of the heat sink assembly of the preferred embodiment. Reference is made to the relevant detailed description hereinabove.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A heat sink assembly comprising:
a socket;
an electronic package mounted on the socket;
a heat sink; and
a clip comprising a pressing member engaged with the socket, and an operating member comprising a pair of resilient portions, the pressing member comprising a pair of opposite pressing portions pressing the heat sink against the electronic package, a pair of cutouts being defined in the pressing member at a side thereof, the resilient portions snappingly engaged with the pressing member in the cutouts.

2. The heat sink assembly as described in claim 1, wherein two catches are provided on opposite sides of the socket, latching legs with fixing holes defined therein extend downwardly from the clip, the fixing holes engagingly receiving the catches therein respectively.

3. The heat sink assembly as described in claim 1, wherein a handle is bent from a top of the operating member, for facilitating operation.

4. The heat sink assembly as described in claim 1, wherein a pair of shoulders is formed at opposite sides of a top portion of the heat sink, the pressing portions of the clip being engaged on the shoulders.

5. The heat sink assembly as described in claim 2, wherein the pressing member further comprises opposite first and second beams interconnecting corresponding opposite ends of the pressing portions.

6. The heat sink assembly as described in claim 5, wherein a tab extends upwardly from a middle portion of the first beam.

7. The heat sink assembly as described in claim 5, wherein the cutouts are defined in a top of a middle portion of the second beam, and the resilient portions are formed inwardly from opposite sides of the operating member.

8. The heat sink assembly as described in claim 5, wherein a first latching leg extends downwardly from a bottom of the operating member, and a second latching leg extends downwardly from a middle portion of the first beam, the first and second latching legs engaging with the catches of the socket.

9. The heat sink assembly as described in claim 5, wherein the pressing portions are each substantially M-shaped.

10. The heat sink assembly as described in claim 5, wherein the pair of cutouts is defined in the pressing portions at opposite sides of the pressing member near the second beam, and upper portions of the resilient portions are received in the cutouts.

11. The heat sink assembly as described in claim 10, wherein a notch is defined in an outer edge of each of the resilient portions.

12. A heat sink assembly comprising:
a socket;
an electronic package mounted on the socket;
a heat sink; and
a clip for pressing the heat sink against the electronic package, the clip comprising an operating member and a pressing member, wherein
the operating member comprises a main body, at least two fastening means are provided in opposite sides of the main body, a first latching leg extends downwardly from a bottom of the main body, and the pressing member comprises a pair of opposite pressing portions pressing the heat sink against the electronic package, the fastening means of the operating member snappingly engages with at least one side of the pressing member, and a second latching leg extends downwardly from the pressing member distal from the first latching leg.

13. The heat sink assembly as described in claim 12, wherein two catches are provided on opposite sides of the socket, the first and second latching legs each define a fixing hole, and the fixing holes engagingly receiving the catches therein respectively.

14. The heat sink assembly as described in claim 12, wherein a handle is bent from a top of the operating member, for facilitating operation.

15. The heat sink assembly as described in claim 12, wherein the pressing member further comprises opposite first and second beams interconnecting corresponding opposite ends of the pressing portions.

16. The heat sink assembly as described in claim 15, wherein two cutouts are defined in a top of a middle portion of the second beam, and the fastening means is snappingly engaged with the second beam in the cutouts.

17. The heat sink assembly as described in claim 15, wherein two cutouts are respectively defined in the pressing portions near the second beam; and the fastening means is engaged with the pressing portions in the cutouts.

18. A heat sink assemble comprising:

a socket sub-assembly;

a heat generating device located on the socket sub-assembly;

a heat sink seated upon said heat generating device, said heat sink defining two side regions;

a clip including a pressing member and an operating member discrete from each other, said pressing member originally configured with a rectangular frame and later bent to form a final curved shape with thereof two opposite pressing portions abutting against said two side regions, a first beam integrally connected between two ends of said two pressing portions and including a first latch leg to fasten to one side the socket sub-assembly; and a second beam integrally connected between other two ends of said two pressing portions in parallel to said first beam, said operating member attached to the pressing member around said second beam, said operating member including a second latch leg to fasten to the other side of the socket sub-assembly and a handle opposite to said second latch leg; wherein said two opposite pressing portions, said first beam and said second beam commonly define generally a periphery of said heat sink.

* * * * *